United States Patent
Wu et al.

(10) Patent No.: US 6,489,030 B1
(45) Date of Patent: Dec. 3, 2002

(54) LOW DIELECTRIC CONSTANT FILMS USED AS COPPER DIFFUSION BARRIER

(75) Inventors: Hui-Jung Wu, Fremont, CA (US); James S. Drage, Fremont, CA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 09/549,390

(22) Filed: Apr. 14, 2000

(51) Int. Cl.[7] .................................................. B32B 9/04
(52) U.S. Cl. ........................ 428/447; 428/448; 428/450; 427/96; 427/387; 438/781
(58) Field of Search ................................. 428/447, 448, 428/450; 427/566, 568, 578, 96, 126.2, 228, 344, 387, 388.2; 438/781

(56) References Cited

U.S. PATENT DOCUMENTS

| | | | |
|---|---|---|---|
| 5,602,060 A | | 2/1997 | Kobayashi et al. .......... 437/238 |
| 6,162,743 A | * | 12/2000 | Chu et al. .................... 438/781 |
| 6,225,238 B1 | * | 5/2001 | Wu .............................. 438/778 |

* cited by examiner

*Primary Examiner*—Robert Dawson
*Assistant Examiner*—Christopher Keehan
(74) *Attorney, Agent, or Firm*—Roberts & Mercanti, LLP

(57) ABSTRACT

A microelectronic device having a cured polycarbosilane diffusion barrier is disclosed. A microelectronic device has a substrate, a dielectric layer on the substrate and metal filled vias formed through the dielectric layer. A covering of a cured polycarbosilane diffusion barrier is on the metal filled vias and the dielectric layer.

24 Claims, No Drawings

LOW DIELECTRIC CONSTANT FILMS USED AS COPPER DIFFUSION BARRIER

BACKGROUND OF THE INVENTION

1. Field of the Invention

The present invention relates to the formation of microelectronic devices such as integrated circuit structures. More particularly, the invention relates to microelectronic devices having a cured polycarbosilane barrier layer.

2. Description of the Related Art

The production of microelectronic devices requires multilevel wiring interconnects regions within the devices. In forming such structures, it is conventional to provide a substrate having first level wiring lines, an interlayer dielectric (ILD) and then second level wiring lines. One or more interconnections are typically formed between the first and second level wiring lines. Openings are formed in the dielectric layer which are filled with a metal to form an interconnect. After the two level interconnect structure is formed, it is necessary to provide another interlevel dielectric (ILD) layer to accommodate further processing of the integrated circuit device. The intermetal dielectric layer usually consists of a layer of a dielectric or an oxide such as silicon oxide which is deposited by plasma enhanced chemical vapor deposition or other processes. The introduction of Cu as the interconnect metal has greatly reduced the RC delay and improved speed of integrated circuits. However, the use of Cu as the interconnect metal also introduces many integration challenges. Copper is known to be a fast diffuser through several dielectrics including silicon dioxide. This leads to integration difficulty for copper damascene structures. A dielectric diffusion barrier on top of the copper conductor is therefore needed. When the damascene approach is taken for forming integrated circuits with copper interconnections, the current fabrication method requires a layer of silicon nitride film on top of the copper interconnection to prevent upward copper diffusion into the ILD. Silicon nitride acts as a copper diffusion barrier over the copper interconnects, however its use involves other problems. In particular, it has a high dielectric constant of about 8 and thus degrades speed and performance resulting from increased in-line and inter-level capacitance and causes a larger RC delay. This speed degradation becomes unacceptable for integrated circuits fabricated using 0.18 μm and more advanced technologies.

According to the invention, these problems are solved by use of a cured polycarbosilane diffusion barrier instead of silicon nitride. Polycarbosilanes are a class of polymer with Si and C as the elements of the polymer backbone. They are inherently less polarizable than silica. Polycarbosilanes contain organic (carbon and hydrogen) or inorganic (hydrogen) groups bonded directly to silicon. These materials are inherently hydrophobic and have low dielectric constants due to their low polarizability and low silanol content. Another advantage of polycarbosilanes is that they are thermally stable. For example, a bridging alkyl group (between Si atoms) is more thermally stable than a pendant alkyl on Si by up to 100° C. Therefore, a low dielectric constant material with good thermal stability can be prepared with polycarbosilanes.

Polycarbosilanes have been used heretofore in the art for the preparation of microelectronic devices. One approach for producing semiconductor devices is known from U.S. Pat. No. 5,602,060 where a polycarbosilane polymer is coated over a semiconductor substrate and then reacted in an oxidizing atmosphere to produce a silicon oxide layer. The present invention does not react polycarbosilanes in an oxidizing atmosphere to convert it to silicon oxide. Rather, the polycarbosilane is cured in an inert or reducing atmosphere to produce a dense, crosslinked polycarbosilane reaction product. As disclosed in Polymerization of C—Si Films on Metal Substrates: Potential Aahesion/diffuision Barrier for Microelectronic, by Li-Chen, et al in Mat. Res. Soc. Symnp. Proc. Vol. 511, 1998. P 297, a monomer (vinyltrichiorosilane or vinyltrimethylsilane) was adsorbed onto substrate surface and then electron beam was used to induce polymerization of the monomer. This led to the formation of film with thickness about 100 Angstroms. However, it is very difficult to form a thick film from this approach. Another problem associated with this approach is that the polymer formed is not thermally stable. For the diffusion barrier or dielectric application, the materials need to be thermally stable up to about 400° C.

The criteria for a good Cu diffusion barrier are a high crosslinking density, i.e. low free volume is necessary, high density, there is no interaction between the barrier and copper, and a high Tg. With a high Tg, the free volume available for copper diffuision is reduced and high film density provides better diffuision barrier characteristics. The polycarbosilanes-derived films of this invention are very dense. The refractive index of the film derived form hydridopolycarbosilane is about 1.54 after cure while refractive index for $SiO_2$ is 1.46. In general, as refractive index increases film density increases. Also the cured films have a high Tg and high crossinking density and copper is not expected to chemically interact with polycarbosilanes-derived films. Therefore, the cured films prepared from polycarbosilanes have low dielectric constant, high density, high Tg, high crosslinking density, and are a good copper barrier.

SUMMARY OF THE INVENTION

The invention provides a microelectronic device comprising a substrate, and a diffusion barrier layer on a surface of the substrate, which diffusion barrier layer comprises a cured polycarbosilane polymer. Preferably the diffusion barrier layer is a copper diffusion barrier.

The invention also provides a process for producing a microelectronic device which comprises depositing a diffusion barrier layer on a surface of the substrate, which diffusion barrier layer comprises a polycarbosilane polymer, and then curing the polycarbosilane polymer in a substantially inert gas or reducing atmosphere to thereby form a cured polycarbosilane polymer on a surface of the substrate.

DETAILED DESCRIPTION OF THE PREFERRED EMBODIMENT

According to the invention, a dielectric layer is deposited onto a substrate. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof.

Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten, silicon oxynitride, and other types of dielectrics. These lines form the conductors or insulators of an integrated circuit. Such are typically closely separated from one another at distances preferably of from about 20 microns or less, more preferably from about 1 microns or less, and most preferably of from about 0.05 to about 1 microns.

The dielectric may be on and between the lines. The dielectric composition may comprise any of a wide variety of dielectric forming materials which are well known in the art for use in the formation of microelectronic devices. The dielectric layer may nonexclusively include vapor phase deposited silicon oxide, carbon doped silica, particularly vapor phase deposited carbon doped silica, carbon doped silicon oxide, and silicon oxynitride, silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica or mixtures thereof.

One useful polymeric dielectric materials useful for the invention include an nanoporous silica alkoxysilane polymer formed from an alkoxysilane monomer which has the formula:

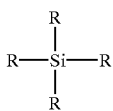

wherein at least 2 of the R groups are independently $C_1$ to $C_4$ alkoxy groups and the balance, if any, are independently selected from the group consisting of hydrogen, alkyl phenyl, halogen, substituted phenyl. Preferably each R is methoxy, ethoxy or propoxy. Such are commercially available from Honeywell International Inc. as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO1.5)_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention nonexclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof Useful organic polymers include polyimides, fluorinated and nonfluorinated polymers, in particular fluorinated and nonfluorinated poly(arylethers) available under the tradename FLARE™ from Honeywell International Inc., and copolymer mixtures thereof The hydroorganosiloxanes, poly(arylene ethers), fluorinated poly (arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. Pat. No. 6,124,421 filed Dec. 12, 1997 which is incorporated herein by reference.

Preferred siloxane materials suitable for use in this invention are commercially available from Honeywell International Inc. under the tradename Accuglass® T-11, T-12 and T-14. Also useful are methylated siloxane polymers available from Honeywell International Inc. under the tradenames Purespin™ and Accuspin® T18, T23 and HOSP™.

Preferred silicon containing dielectric resins include polymers having a formula selected from the group consisting of $[(HSiO_{1.5})_xO_y]_n(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. Pat. No. 6,020,410 filed Oct. 22, 1997 and which is incorporated herein by reference. Also preferred are certain low organic content silicon containing polymers such as those having the formula I:

$[H—SiO_{1.5}]_n[R—SiO_{1.5}]_m$

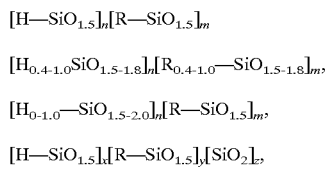

$[H—SiO_{1.5}]_x[R—SiO_{1.5}]_y[SiO_2]_z$, wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. Pat. No. 6,218,497, filed Mar. 20, 1998, which is incorporated herein by reference. Also preferred are certain low organic content silicon containing polymers such as those having the formula II:

$[HSiO_{1.5}]_n[RSiO_{1.5}]_m$,

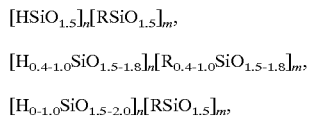

wherein the sum of n and m is from about 8 to about 5000 and m is selected such that the carbon containing substituent is present in an amount of from about 40 Mole percent or greater; and

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. Pat. No. 6,143,855, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cycloheptanone and cyclooctanone; cyclic amides such as N-alkylpyrrolidinone wherein the alkyl group has from 1 to about 4 carbon atoms, and N-cyclohexyl-pyrrolidinone, and mixtures thereof.

Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm$^3$ to about 3 g/cm$^3$.

The dielectric layer may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The polymer layer may also optionally be exposed to actinic light, such as TV light, to increase its molecular weight. The amount of exposure may range from about 100 mJ/cm$^2$ to about 300 mJ/cm$^2$.

The dielectric layer may optionally be overall exposed to electron beam radiation to cure the dielectric. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of Honeywell International Inc. under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 μC/cm$^2$ and more preferably from about 50 to about 20,000 μC/cm$^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Trenches and vias are then formed in the dielectric layer by well known photolithographic techniques using a photoresist composition. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. The trenches and vias are then formed by etching techniques which are well known in the art. Next the photoresist is completely removed from the dielectric surface and the inside walls of the vias by plasma etching. Plasma generators which are capable of are described in U.S. Pat. Nos. 5,174,856 and 5,200,031.

Next the trenches and vias and the top of the dielectric are lined with a barrier metal which serves to separate the dielectric from a fill metal which is to be deposited into the lined trenches and vias. Suitable barrier metals include titanium, titanium nitride, tantalum and tantalum nitride. Such may be applied by well known sputtering, evaporation, electroplating or vapor deposition techniques.

Next the lined trenches and vias are filled with a conductive metal which fills the trenches and vias and also forms a layer top on the hardened dielectric. Suitable fill metals include aluminum, aluminum alloys, copper, copper alloys, tantalum, tungsten, titanium or other metal typically employed in the formation of microelectronic devices. However, copper is most preferred. The metal may be applied by such techniques as vapor deposition, sputtering, evaporation, electroplating and the like.

Then the fill metal is planarized and removed from the top of the dielectric such as by proper combinations of chemical-mechanical polishing (CMP), plasma etch, wet etch and electropolishing.

Now a layer of the polycarbosilane barrier is deposited over the fill metal and dielectric. The preferred polycarbosilane polymer has the formula —$(R_1SiR_2R_3)_n$— wherein $R_1$ is an substitute or unsubstituted alkylene, cycloalkylene, or arylene group. $R_2$ and $R_3$ are independently a hydrogen atom, a substituted or unsubstituted alkyl group having from 1 to six carbon atoms, a substituted or unsubstituted alkylene group having from 1 to six carbon atoms, or a substituted or unsubstituted aryl group and n ranges from about 6 to about 10,000. Preferably $R_2$ and $R_3$ are hydrogen atoms. In one preferred embodiment, the polycarbosilane polymer is a hydridocarbosilane polymer. In another preferred embodiment, $R_2$ and $R_3$ independently are hydrogen, methyl, or phenyl. The organic moiety between two silicon atoms can be, but is not limited to, methylene, phenylene, and fluorinated phenylene. In another preferred embodiment, about 8% to about 12% of the $R_2$ groups are unsubstituted propylene groups and the balance $R_2$ and $R_3$ are hydrogen atoms. For the purposes of this invention, the term substituted means that the indicated group can be replaced by any substituents which would not have an adverse effects on the desired barrier layer properties and results.

Polycarbosilanes are commercially available, for example from Starfire Co. located in Watervliet, N.Y., or they can be can be polymerized from silane monomers such as those available from Huels America of Somerset, N.J. Alternatively, they can be synthesized via several methods known in the art. Examples of polycarbosilanes syntheses are shown below:

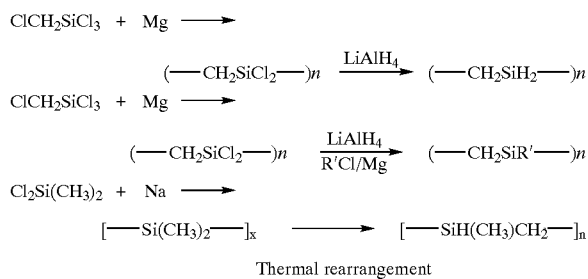

Thermal rearrangement where x ranges from about 10 to about 2000 and n ranges from about 10 to about 10,000. The approaches and the reagents that can be used to prepare polycarbosilanes are not limited to the above examples. The polycarbosilane polymer is generally a viscous liquid or a soluble solid. It can be dissolved in organic solvents and spin coat onto a substrate. The spun films are then heated, either in air or preferably in an inert atmosphere such as nitrogen, to remove substantially all solvents. The films are then cured in order to crosslink the polymer and density the film and to optimize the barrier properties of the film.

The curing may be conducted by heating the polycarbosilane polymer at a sufficient temperature and for a sufficient time to cure the polycarbosilane polymer. The curing may be conducted by heating coated the polycarbosilane polymer at a temperature of from about 80° C. to about 500° C. for from about 1 minute to about 2 hours. The curing may also be conducted by exposing the polycarbosilane polymer to high energy irradiation, such as uv, x-ray, electron beam, or ionizing radiation under conditions sufficient to cure the polycarbosilane polymer. The exposing conditions may easily be determined by those skilled in the art. In one particularly preferred embodiment, the curing is conducted by exposing the polycarbosilane polymer to sufficient electron beam irradiation under conditions sufficient to cure the polycarbosilane polymer. Such may be similar to those mentioned above for the curing of the dielectric layer. The curing preferably takes place in a controlled atmosphere, preferably an inert or reducing atmosphere. Inert gases non-exclusively include nitrogen, argon, xenon or any combination of these gases. Reducing atmospheres non-exclusively include hydrogen, a mixture of hydrogen and nitrogen and other inert atmospheres.

Next the cured polycarbosilane diffusion barrier layer may be planarized by chemical-mechanical polishing (CMP), plasma etch, wet etch or electropolishing to produce the desired structure. The fill metal is covered by the cured polycarbosilane diffusion barrier, and the need for a silicon nitride layer has thereby been eliminated. The structure may then be applied with another second layer dielectric of any of the dielectrics materials mentioned above and the process steps repeated for the next wiring level. It is to be understood that these steps may be repeated to provide a series of suitable layers and conductive paths over one another on the substrate.

The cured polycarbosilane films have low dielectric constant which typically range from about 2.5 to about 8, or more preferably from about 3 to about 5. They have a high Tg which is typically about 350° C. or above and preferably about 400° C. or above.

The following non-limiting examples serve to illustrate the invention.

EXAMPLE 1

A thin film of Flare™ poly(arylene ether) polymer, is formed on a 4" silicon wafer using a conventional spin-coating technique. After spin-coating, the film is subjected to a hot-plate bake at a temperature of 150, 200 AND 250° C. for 1 minute, respectively. The film thickness after the spinning and baking processes is in the range of 8000 to 10000 Å. Thermal curing is carried out at 425° C. for one hour in a horizontal furnace with $N_2$ flow at atmospheric pressure.

The coated substrate is spin coated with AZ-P4620 photoresist from Clariant Corporation of Somerville, N.J. and baked. The photoresist is then imagewise exposed to ultra-violet radiation through a mask. The photoresist is then developed using an aqueous alkaline solution to remove the nonimage portions and define a via mask. Vias are then formed by etching. Next the photoresist is removed from the dielectric surface and the inside walls of the vias by plasma ashing in a plasma chamber using an etching tool. The wafer is then rinsed in a solvent to remove post etch metal residues. A deionized water rinse follows. The via filled by sputtering a copper barrier metal and copper CVD seed layer. Then copper is deposited by electroplating. The copper is then chemical mechanical polished until the dielectric layer is reached.

The copper vias and upper surface of the dielectric layer is then coated with a hydridopolycarbosilane polymer from Starfire Co. The hydridopolycarbosilane polymer is then baked on a hot plate at 80, 150 and 220° C. for one minute, respectively, and then cured by heating in a nitrogen atmosphere at a temperature of 400° C. for 1 hour. The cured polymer is then optionally planarized and the process is repeated.

EXAMPLE 2

A thin film of a HOSP™ a dielectric available from Honeywell International Inc. is formed on a 4" silicon wafer using a conventional spin-coating technique. After spin-coating, the film is subjected to a hot-plate bake at a temperature of 150, 200 and 350° C. for 1 minute, respectively. The film thickness after the spinning and baking processes is in the range of 4000 to 7000 Å. Thermal curing is carried out at 425° C. for one hour in a horizontal furnace with $N_2$ flow at atmospheric pressure.

The coated substrate is spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a via mask. Vias are then formed by etching. Next the photoresist is removed from the dielectric surface and the inside walls of the vias by plasma ashing in a plasma chamber using an etching tool. The wafer is then rinsed in a solvent to remove post etch metal residues. A deionized water rinse follows. The via is filled by sputtering a copper barrier metal and copper seed. The copper is deposited by electroplating. The copper is then chemical mechanical polished until the dielectric layer is reached.

The copper vias and upper surface of the dielectric layer is then spin coated with a allylhydridopolycarbosilane polymer wherein about 10% of the groups are unsubstituted propylene groups and the balance are hydrogen atoms. After spin-coating, the film is subjected to a hot-plate bake at a temperature of 80, 150, and 220° C. for 1 minute, respectively. The polycarbosilane polymer is then cured by heating in a nitrogen atmosphere at a temperature of 400° C. for 1 hour. The cured polymer is then optionally planarized and the process is repeated.

EXAMPLE 3

A thin film of Flare™, a poly(arylene ether) polymer, is formed on a 4" silicon wafer using a conventional spin-coating technique. After spin-coating, the film is subjected to a hot-plate bake at a temperature of 150, 200, and 250° C. for 1 minute, respectively. The film thickness after the spinning and baking processes is in the range of 8000 to 10000 Å. Thermal curing is carried out at 425° C. for one hour in a horizontal furnace with $N_2$ flow at atmospheric pressure.

The coated substrate is spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a via mask. Vias are then formed by etching. Next the photoresist is removed from the dielectric surface and the inside walls of the vias by plasma ashing in a plasma chamber using an etching tool. The wafer is then rinsed in a solvent to remove post etch metal residues. A deionized water rinse follows. The via filled by sputtering a copper barrier metal and copper CVD seed layer. Then copper is deposited by electroplating. The copper is then chemical mechanical polished until the dielectric layer is reached.

The copper vias and upper surface of the dielectric layer is then coated with a hydridopolycarbosilane polymer from Starfire Co. The hydridopolycarbosilane polymer is then cured by electron beam exposure. Electron beam exposure is conducted in an ElectronCure™ 30 chamber which is commercially available from AlliedSignal and which incorporates a large area electron source and quartz lamps for heating the wafer. The cold-cathode gas source produces a large area electron beam (over 200 mm in diameter) having a substantially uniform emission over its entire surface. Electron emission is controlled by the low bias voltage applied to the anode grid. The electron beam penetration depth is about 4000 Å. Electron beam exposure was conducted at a temperature of 200° C. and in an argon atmosphere (10–30 milliTorr). The cured polymer is then planarized and the process is repeated.

EXAMPLE 4

10.2 g of allylhydridopolycarbosilane (AHPCS) purchased from Starfire was dissolved in 57.8 g 3-pentanone to make 15% solution. Then it was filtered through 0.2 micron Teflon filter before use. About 2 mL of the solution was deposited onto a 4" silicon wafer and then spun at 5000 rpm for 30 seconds. Then it was baked at 80C, 150C, and 220C for one minute respectively. The wafer was then cured at 425C under nitrogen for 60 minute and a uniform film was obtained. Refractive index and thickness of the obtained film was measured by Woollam ellipsometer before and after cure. The film has thickness of 2825 Å with refractive index of 1.56 after hot plate bake and prior to furnace cure (425C). After cure at 425C, a film with thickness of 2462 Å and refractive index of 1.527 was obtained.

EXAMPLE 5

4.5 g of hydridopolycarbosilane (HPCS) purchased from Starfire was dissolved in 25.5 g dibutyl ether to make 15% solution. Then it was filtered through 0.2 micron Teflon filter before use. About 2 mL of the solution was deposited onto a 4" silicon wafer and then spun at 2500 rpm for 30 seconds. Then it was baked at 80C, 150C, and 220C for one minute respectively. The wafer was then cured at 425C under nitrogen for 60 minute and a uniform film was obtained. Refractive index and thickness of the obtained film was measured by Woollam ellipsometer before and after cure. The film has thickness of 1840 Å with refractive index of 1.55 after hot plate bake and prior to furnace cure (425C). After cure at 425C, a film with thickness of 1644 Å and refractive index of 1.54 was obtained.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A microelectronic device comprising a substrate, a pattern of copper on the substrate, and a diffusion barrier layer on a surface of the copper, which diffusion barrier layer comprises a cured polycarbosilane polymer.

2. The microelectronic device of claim 1 wherein the polycarbosilane polymer has the formula —$(R_1SiR_2R_3)_n$— wherein $R_1$ is an substitute or unsubstituted alkylene, cycloalkylene, or arylene group $R_2$ and $R_3$ are independently a hydrogen atom, a substituted or unsubstituted alkyl group having from 1 to six carbon atoms, a substituted or unsubstituted alkylene group having from 1 to six carbon atoms, or a substituted or unsubstituted aryl group and n ranges from about 6 to about 10000.

3. The microelectronic device of claim 2 wherein $R_2$ and $R_3$ are hydrogen atoms.

4. The microelectronic device of claim 2 wherein about 8% to about 12% of the $R_2$ groups are unsubstituted propylene groups and the balance are hydrogen atoms.

5. The microelectronic device of claim 2 wherein the polycarbosilane polymer comprises a hydridocarbosilane polymer.

6. The microelectronic device of claim 1 which comprises a pattern of copper lines on the substrate and a dielectric between the lines.

7. The microelectronic device of claim 6 wherein the dielectric comprises a silicon containing polymer, an alkoxysilane polymer, a silsesquioxane polymer, a siloxane polymer, a poly(arylene ether), a fluorinated poly(arylene ether), a nanoporous silica, $SiO_2$ or combinations thereof.

8. The microelectronic device of claim 1 wherein the substrate comprises a semiconductor or insulating material.

9. The microelectronic device of claim 1 wherein the substrate comprises gallium arsenide, germanium, silicon, silicon germanium, lithium niobate, compositions containing silicon or combinations thereof.

10. A process for producing a microelectronic device which comprises depositing a diffusion barrier layer a pattern of copper, which pattern of copper is on a surface of a substrate, which diffusion barrier layer comprises a polycarbosilane polymer, and then curing the polycarbosilane polymer in a substantially inert gas or reducing atmosphere to thereby form a cured polycarbosilane polymer on a surface of the substrate.

11. The process of claim 10 wherein the polycarbosilane polymer has the formula —$(R_1SiR_2R_3)_n$— wherein $R_1$ is an substitute or unsubstituted alkylene, cycloalkylene, or arylene group $R_2$ and $R_3$ are independently a hydrogen atom, a substituted or unsubstituted alkyl group having from 1 to six carbon atoms, a substituted or unsubstituted alkylene group having from 1 to six carbon atoms, or a substituted or unsubstituted aryl group and n ranges from about 6 to about 10000.

12. The process of claim 10 wherein $R_2$ and $R_3$ are hydrogen atoms.

13. The process of claim 10 wherein about 8% to about 12% of the $R_2$ groups are unsubstituted propylene groups and the balance are hydrogen atoms.

14. The process of claim 10 wherein the polycarbosilane polymer comprises a hydridocarbosilane polymer.

15. The process of claim 14 wherein the dielectric comprises a silicon containing polymer, an alkoxysilane polymer, a silsesquioxane polymer, a siloxane polymer, a poly(arylene ether), a fluorinated poly(arylene ether), a nanoporous silica, silica or combinations thereof.

16. The process of claim 10 wherein the substrate comprises a semiconductor or insulating material.

17. The process of claim 10 wherein the substrate comprises gallium arsenide, germanium, silicon, silicon germanium, lithium niobate and compositions containing silicon or combinations thereof.

18. The process of claim 10 wherein the curing is conducted by heating the polycarbosilane polymer at a sufficient temperature and for a sufficient time to cure the polycarbosilane polymer.

19. The process of claim 10 wherein the curing is conducted by heating the polycarbosilane polymer at a temperature of from about 350° C. to about 500° C. for from about 1 minute to about 2 hours.

20. The process of claim 10 wherein the curing is conducted by exposing the polycarbosilane polymer to high energy irradiation under conditions sufficient to cure the polycarbosilane polymer.

21. The process of claim 10 wherein the curing is conducted by exposing the polycarbosilane polymer to sufficient electron beam irradiation under conditions sufficient to cure the polycarbosilane polymer.

22. The process of claim 21 wherein the electron beam exposing is conducted at an energy level ranging from about 0.5 to about 30 KeV.

23. The process of claim 21 wherein the electron beam exposing is conducted at an electron dose ranging from about 1 to about 50,000 $\mu C/cm^2$.

24. The process of claim 21 wherein the electron beam exposing is conducted with a wide, large beam of electron beam radiation from a large-area electron beam source.

\* \* \* \* \*